United States Patent
Lin et al.

(10) Patent No.: US 10,975,889 B2
(45) Date of Patent: Apr. 13, 2021

(54) FAN MODULE AND ELECTRONIC DEVICE

(71) Applicant: Coretronic Corporation, Hsin-Chu (TW)

(72) Inventors: Shih-Hang Lin, HsinChu (TW); Chih-Cheng Chou, HsinChu (TW)

(73) Assignee: Coretronic Corporation, Hsin-Chu (TW)

( * ) Notice: Subject to any disclaimer, the term of this patent is extended or adjusted under 35 U.S.C. 154(b) by 140 days.

(21) Appl. No.: 16/398,289

(22) Filed: Apr. 30, 2019

(65) Prior Publication Data
US 2020/0003231 A1  Jan. 2, 2020

(30) Foreign Application Priority Data
Jun. 27, 2018  (CN) .................. 201821000357.X

(51) Int. Cl.
*F04D 29/66* (2006.01)
*H05K 7/20* (2006.01)
*F04D 29/18* (2006.01)

(52) U.S. Cl.
CPC ......... *F04D 29/666* (2013.01); *F04D 29/181* (2013.01); *H05K 7/20172* (2013.01)

(58) Field of Classification Search
CPC .... F04D 29/329; F04D 29/362; F04D 29/364; F04D 29/366; F04D 29/66; F04D 29/661; F04D 29/666; F04D 29/667; F04D 29/668; H05K 7/20172; G06F 1/20; G06F 1/203; G06F 1/206
See application file for complete search history.

(56) References Cited

U.S. PATENT DOCUMENTS 4,173,995 A * 11/1979 Beck ................... H05K 7/20181
5,236,306 A *  8/1993 Hozak ................ B60H 1/00464
                                                          310/62

(Continued)

FOREIGN PATENT DOCUMENTS

| CN | 106402022 A | * | 2/2017 | ........... F04D 29/325 |
| TW | 595764 | | 6/2004 | |
| TW | M354786 | | 4/2009 | |

OTHER PUBLICATIONS

Jang, C. Effects of Inflow Distortion due to Hub Cap's Shape on the Performance of Axial Flow Fan, J. of Fluid Science and Technology, vol. 3 No. 5 pp. 598-609, Jan. 2008 (Year: 2008).*

(Continued)

*Primary Examiner* — Igor Kershteyn
*Assistant Examiner* — Topaz L. Elliott
(74) *Attorney, Agent, or Firm* — JCIPRNET

(57) ABSTRACT

A fan module and an electronic device are provided. The fan module includes a hub and a plurality of blades. The blades are mounted around the hub, and each of the blades has a first end that is connected to a periphery of the hub and a second end that is relatively away from the hub. A first axial direction distance in the axial direction is provided between a first point of the first end that is relatively away from the top surface and the top surface. A second axial direction distance in the axial direction is provided between a second point of the first end that is near the top surface and the top surface. A ratio of the second axial direction distance to the first axial direction distance is 0.4 to 0.5.

8 Claims, 3 Drawing Sheets

(56) References Cited

U.S. PATENT DOCUMENTS

| | | | | |
|---|---|---|---|---|
| 5,399,070 A * | 3/1995 | Alizaden | ............... | F04D 29/329 |
| | | | | 416/189 |
| 5,996,685 A * | 12/1999 | Alizadeh | ............... | F04D 29/326 |
| | | | | 123/41.49 |
| 6,343,484 B1 * | 2/2002 | Hong | ................... | F04D 29/325 |
| | | | | 62/411 |
| 6,735,076 B2 * | 5/2004 | Lin | ........................ | G06F 1/20 |
| | | | | 165/121 |
| 6,981,843 B2 * | 1/2006 | Chiu | .................... | F04D 29/325 |
| | | | | 415/220 |
| 7,101,149 B2 * | 9/2006 | Huber | ................. | F04D 29/582 |
| | | | | 257/E23.099 |
| 7,802,969 B2 | 9/2010 | Lee et al. | | |
| 8,043,064 B2 * | 10/2011 | Huang | ................ | F04D 29/666 |
| | | | | 416/223 R |
| 8,403,651 B2 * | 3/2013 | Hsu | ..................... | F04D 25/0613 |
| | | | | 417/423.1 |
| 8,408,884 B2 * | 4/2013 | Hsu | ..................... | H05K 7/20181 |
| 2009/0269195 A1 * | 10/2009 | Hsu | ....................... | F04D 29/542 |
| | | | | 415/208.2 |
| 2010/0124505 A1 | 5/2010 | Huang et al. | | |
| 2016/0327062 A1 * | 11/2016 | Amin-Shahidi | ... | H05K 7/20181 |
| 2018/0209438 A1 * | 7/2018 | Decker | ................ | F04D 29/329 |

OTHER PUBLICATIONS

Kim, J. Axial-Flow Ventilation Fan Design Through Multi-Objective Optimization to Enhance Aerodynamic Performance, J. of Fluids Engineering, vol. 133, Oct. 2011 (Year: 2011).*

Derksen (Aerodynamic shape optimization of axial flow fan nose cones, WIT Transaction ont he Built Environment, vol. 125, pp. 109-118, 2012 (Year: 2012).*

* cited by examiner

FAN MODULE AND ELECTRONIC DEVICE

CROSS-REFERENCE TO RELATED APPLICATION

This application claims the priority benefit of China application serial no. 201821000357.X, filed on Jun. 27, 2018. The entirety of the above-mentioned patent application is hereby incorporated by reference herein and made a part of this specification.

BACKGROUND OF THE INVENTION

1. Field of the Invention

The disclosure relates to a fan module and an electronic device, and more particularly to an electronic device comprising the fan module.

2. Description of Related Art

A fan is a type of active heat dissipation device that is the most widely used in the current electronic devices and has the most efficient heat dissipation effect. Active heat dissipation is accomplished by using a fan to draw the cold air from outside to inside, so as to exhaust the heat in a system. As temperature of internal heat sources of the system increases, a rotational speed of the fan may also be increased to prompt the process of heat dissipation. In general, the airflow is drawn into the fan from a fan inlet along a direction parallel to a central axis of a hub of the fan (i.e. an axial direction), and the direction of the airflow may be effected to change by the rotation of the blades. In the process, the air from the inlet hits directly at a front edge of the blades (i.e. a part of the blades connected to the hub). A pressure variation may be caused and a fluctuation at the front edge may thus be caused, resulting in undesirable noise. Additionally, barriers in the system may also affect the airflow out of the fan and an increase in blade-passing frequency noise and broadband noise may be generated by the blades.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY OF THE INVENTION

The disclosure provides a fan module capable of reducing noise caused during operation.

The disclosure further provides an electronic device including the fan module having an advantage of low noise.

Other purposes and advantages of the disclosure may be further understood from the technical features disclosed by the disclosure.

To achieve one, some, or all of the purposes or other purposes described above, an embodiment of the disclosure provides a fan module. The fan module includes a hub and a plurality of blades. The hub has a top surface and a central axis, and a direction parallel to the hub is an axial direction. The blades are disposed around the hub, and each of the blades has a first end connected to a periphery of the hub and a second end that is relatively away from the hub. A first axial direction distance in the axial direction is provided between a first point of the first end that is relatively away from the top surface and the top surface. A second axial direction distance in the axial direction is provided between a second point of the first end that is relatively near the top surface and the top surface. A ratio of the second axial direction distance to the first axial direction distance is 0.4 to 0.5.

Another embodiment of the disclosure provides an electronic device. The electronic device includes a housing and a fan module. The fan module is disposed in the housing and includes a hub and a plurality of blades. The hub includes a top surface and a central axis, and a direction parallel to the central axis is an axial direction. The blades are disposed around the hub, and each of the blades has a first end connected to a periphery of the hub and a second end that is relatively away from the hub. A first axial direction distance in the axial direction is provided between a first point of the first end that is relatively away from the top surface and the top surface. A second axial direction distance in the axial direction is provided between a second point of the first end that is relatively near the top surface and the top surface. A ratio of the second axial direction distance to the first axial direction distance is 0.4 to 0.5.

In view of the foregoing, the embodiments of the disclosure may achieve at least one of the following advantages or effects. In the design of the fan module according to an embodiment of the disclosure, with the ratio of the second axial direction distance in the axial direction measured between the second point of the first end of the blades that is relatively near the top surface of the hub and the top surface to the first axial direction distance in the axial direction measured between the first point of the first end of the blades that is relatively away from the top surface of the hub and the top surface being 0.4 and 0.5, a pressure variation at the first end of the blades connected to the periphery of the hub caused by airflow may be decreased. Thus, noise is effectively reduced. In this way, the fan module according to an embodiment of the disclosure may reduce the noise caused during operation, and the electronic device to which the fan module is applied may have an advantage of low noise.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
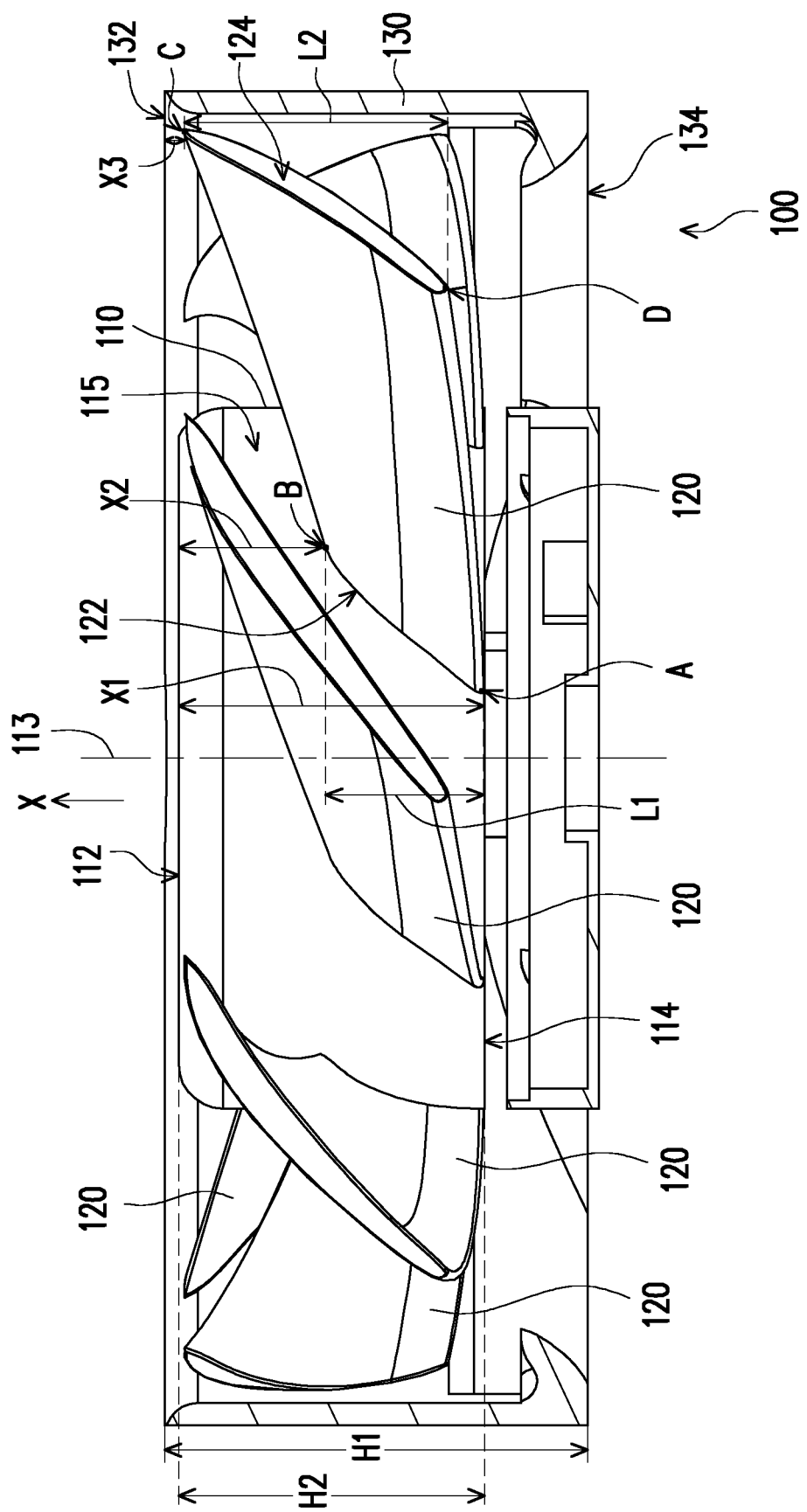
FIG. 1 is a perspective partial cross-sectional view of a fan module according to an embodiment of the invention.

FIG. 1 is a perspective partial cross-sectional view of a fan module according to an embodiment of the disclosure. Referring to FIG. 1, in the embodiment, a fan module 100 includes a hub 110 and a plurality of blades 120. The hub 110 has a top surface 112 and a central axis 113, and a direction parallel to the central axis 113 is an axial direction X. The blades 120 are mounted around the hub 110, and each of the blades 120 has a first end 122 connected to a periphery 115 of the hub 110 and a second end 124 that is relatively away from the hub 110. A first axial direction distance X1 in the axial direction X is provided between a first point A of the first end 122 that is relatively away from the top surface 112 and the top surface 112. A second axial direction distance X2 in the axial direction X is provided between a second point B of the first end 122 that is relatively near the top surface 112 and the top surface 112. In particular, a ratio of the second axial direction distance X2 to the first axial direction distance X1 is 0.4 to 0.5.

More specifically, the hub 110 according to the embodiment is substantially a central part of the fan module 100. A drive motor (not shown) may be disposed in the hub 110 to drive the blades 120 to rotate. The hub 110 further has a bottom surface 114 opposite to the top surface 112. The blades 120 have the first end 122 and the second 124 that are opposite each other. The first end 122 is connected to the periphery 115 of the hub 110 and is disposed between the second end 124 and the hub 110. The first end 122 has the first point A that is relatively near the bottom surface 114 of the hub 110 and the second point B that is relatively near the top surface 112 of the hub 110. The second end 124 has a third point C and a fourth point D. The third point C is relatively near the top surface 112 of the hub 110 and may be aligned with the top surface 112 of the hub 112. However, the disclosure is not limited thereto. The third point C may also not be aligned with the top surface 112 of the hub 110, and the fourth point D is relatively near the bottom surface 114 of the hub 110.

As shown in FIG. 1, the third point C of the blades 120 is the highest point, while the first point A is the lowest point. However, the disclosure is not limited thereto. In other embodiments not shown, it is also possible that the first point and the fourth point of the blades are aligned with each other and are both the lowest points. Such a configuration is also within the scope of the invention to be protected. The first axial direction distance X1 is a perpendicular distance between the first point A of the blades 120 and the top surface 112 of the hub 110, while the second axial direction distance X2 is a perpendicular distance between the second point B of the blades 120 and the top surface 112 of the hub 110. The first axial direction distance X1 and the second axial direction distance X2 are both measured along the axial direction X. On the other hand, a perpendicular distance between the second point B and the first point A of the blades 120 is defined as a first perpendicular length L1, and a perpendicular distance between the third point C and the fourth point D of the blades 120 is defined as a second perpendicular length L2. The first perpendicular length L1 and the second perpendicular length L2 are both measured along the axial direction X. More preferably, the first perpendicular length L1 of the first end 122 of each of the blades 120 in the axial direction X is less than the second perpendicular length L2 of the second end 124 in the axial direction X. In other words, a length of the second end 124 of the blades 120 is greater than a length of the first end 122.

Additionally, the fan module 100 according to the embodiment further includes a frame 130. The hub 110 is mounted into the frame 130, and the blades 120 are disposed between the frame 130 and the hub 110. Further, the frame 130 has an upper surface 132 and a lower surface 134 that are opposite each other. The upper surface 132 is close to the top surface 112 of the hub 110, and a first perpendicular height H1, i.e. a height of the frame 130 in the axial direction X, is provided between the upper surface 132 and the lower surface 134. A second perpendicular height H2, i.e. a height of the hub 110 in the axial direction X, is provided between the top surface 112 and the bottom surface 114 of the hub 110. More preferably, the first perpendicular height H1 is greater than the second perpendicular height H2. In other words, the frame 130 is higher than the hub 110, so as to protect the hub 110 and the blades 120. Moreover, a third axial direction distance X3 in the axial direction X is provided between the third point C of the second end 124 of each of the blades 120 that is relatively near the upper surface 132 and the upper surface 132. More preferably, the third axial direction distance X3 is 0.05 to 0.1 times the first perpendicular height H1. In other words, the highest point (i.e. the third point C) of the blades 120 is lower than the upper surface 132 of the frame 130, and the third axial direction distance X3 may be considered as a safe distance. In addition, in the embodiment, the airflow may, for example, flow in a direction from the top surface 112 of the hub 110 of the fan module 100 to the bottom surface 114.

To put it simply, in the design of the fan module 100 according to the embodiment, with the ratio, of the second axial direction distance X2 in the axial direction X measured between the second point B of the first end 122 of the blades 122 that is relatively near the top surface 112 of the hub 110 and the top surface 112 to the first axial direction distance X1 in the axial direction X measured between the first point A of the first end 122 of the blades 120 that is relatively away from the top surface 112 of the hub 110 and the top surface 112 being 0.4 to 0.5, an inflow field buffer zone is created to decrease pressure variations and pressure fluctuations of the first end 122 of the blades 120 connected to the periphery 115 of the hub 110, so as to effectively reduce the noise generated by the fan module 100 during operation.

Figure 2:
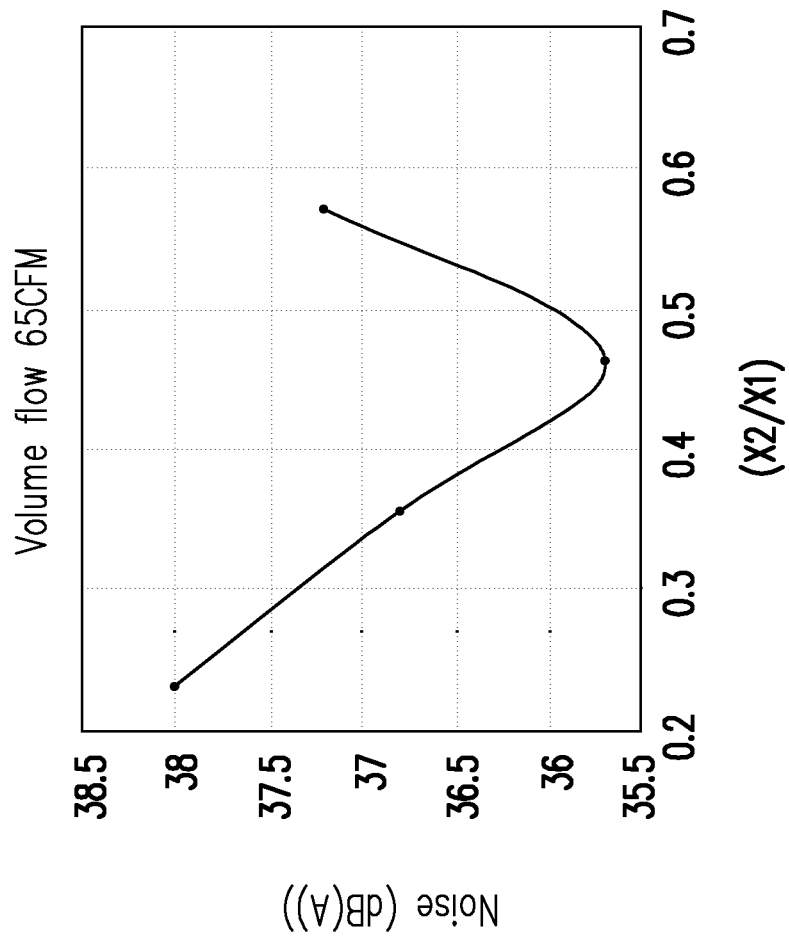
FIG. 2 is a curve diagram illustrating a ratio of a second axial direction distance to a first axial direction distance and noise of different blades in case of the same volume flow entering a system.

FIG. 2 is a curve diagram of a ratio of a second axial direction distance to a first axial direction distance and noise of different blades in case of the same volume flow entering a system. Referring to FIG. 2, FIG. 2 illustrates a simulated experiment conducted in the situation that volume flow is 65 CFM. As indicated in FIG. 2, when a ratio of the second axial direction distance X2 to the first axial direction distance X1 is 0.23, the noise level is 38 dB(A). When the ratio of the second axial direction distance X2 to the first axial direction distance X1 is 0.36, the noise level is 36.8 dB(A). When the ratio of the second axial direction distance X2 to the first axial direction distance X1 is 0.46, the noise level is 35.7 dB(A) When the ratio of the second axial direction distance X2 to the first axial direction distance X1 is 0.57, the noise level is 37.2 dB(A). In view of the above, it can be seen that in the case of the same volume flow entering the system, when the ratio of the second axial direction distance X2 to the first axial direction distance X1 is 0.4 to 0.5, the noise level may be reduced by 2 dB(A) to 2.5 dB(A), to produce the most desirable effect of reducing noise. In other words, according to the embodiment, with the ratio of the second axial direction distance X2 to the first axial direction distance X1 being 0.4 to 0.5, the noise generated by the fan module 100 during operation may be effectively reduced.

Figure 3:
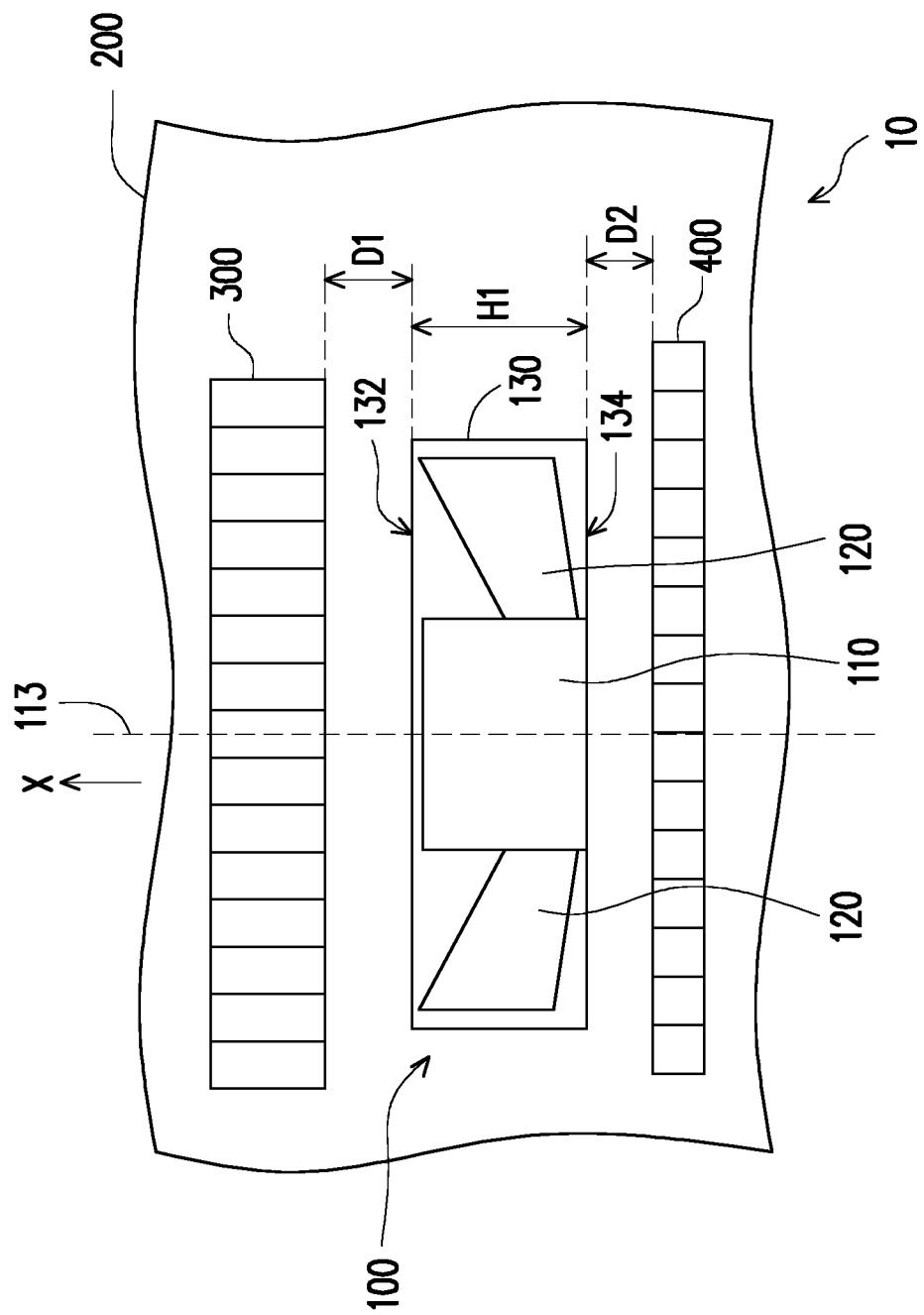
FIG. 3 is a cross-sectional view of an electronic device according to an embodiment of the disclosure.

FIG. 3 is a cross-sectional view of an electronic device according to the disclosure. Referring to FIG. 3, an electronic device 10 according to the embodiment includes the fan module 100 and a housing 200, and the fan module 100 is mounted in the housing 200. Additionally, the electronic device 10 is, for example, an electronic device in a projection system. However, the disclosure is not limited thereto. The electronic device 10 according to the embodiment includes the fan module 100. With regard to the fan module 100, with the ratio of the second axial direction distance X2 to the first axial direction distance X1 being 04 to 0.5, the inflow field buffer zone is created to decrease the pressure variations and pressure fluctuations of the first end 122 of the blades 120 that are caused by the airflow, so as to reduce noise effectively. Therefore, the electronic device 10 according to the embodiment has an advantage of low noise.

Additionally, the electronic device 10 according to the embodiment further includes a first element 300 that is disposed in the housing 200. A first perpendicular distance D1 between the first element 300 and the upper surface 132 of the frame 130 in the axial direction X is preferably greater than 0 and is less than 0.4 times the first perpendicular height H1. Moreover, the electronic device 10 further includes a second element 400 that is disposed in the housing 200. A second perpendicular distance D2 in the axial direction X between the second element 400 and the lower surface 134 of the frame 130 is preferably greater than 0 and is less than 0.4 times the first perpendicular height H1. Additionally, the upper surface 132 of the frame 130 may be considered as an air inlet, while the lower surface 134 of the frame 130 may be considered as an air outlet. The first element 300 is disposed near the air inlet, while the second element 400 is disposed near the air outlet. The first element 300 and the second element 400 may specifically be a heat sink, a rubber part or a metal part used to fix the fan module 100. Alternatively, the first element 300 and the second element 400 may be a metal housing of an optical engine (for example, the optical engine may include a lens, a wavelength conversion device, an optical filter, a light valve, a circuit board, a power supply device, etc.) and such like. However, the disclosure is not limited thereto. The first perpendicular distance D1 between the first element 300 and the upper surface 132 of the frame 130 may be equal to, greater than or less than the second perpendicular distance D2 between the second element 400 and the lower surface 134 of the frame 130. However, the disclosure is not limited thereto.

The electronic device 10 according to the embodiment includes the fan module 100. With regard to the fan module 100, with the ratio of the second axial direction distance X2 to the first axial direction distance X1 being 0.4 to 0.5, the inflow field buffer zone is created to decrease the pressure variations and pressure fluctuations of the first end 122 of the blades 120 that are caused by the airflow. The above configuration reduces the impedance resistance caused by the first element 300, the second element 400 or other barriers in the electronic device 10 and changes the blade-passing frequency noise generated by the blades 120 in a state of producing air.

In view of the foregoing, the embodiments of the disclosure may achieve one of the following advantages or effects. In the design of the fan module according to an embodiment of the disclosure, with the ratio of the second axial direction distance in the axial direction measured between the second point of the first end of the blades that is relatively near the top surface of the hub and the top surface to the first axial direction distance in the axial direction measured between the first point of the first end of the blades that is relatively away from the top surface of the hub and the top surface being 0.4 to 0.5, the pressure variations which are caused by the airflow of the first end of the blades connected to the periphery of the hub decrease, so as to reduce the noise effectively. In this way, the fan module according to an embodiment of the disclosure may reduce the noise caused during operation, and the electronic device to which the fan module is applied has an advantage of low noise.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fan module, comprising:
a hub, wherein the hub has a top surface and a central axis, and a direction parallel to the central axis is an axial direction,
a plurality of blades, wherein the plurality of blades are mounted around the hub, and each of the plurality of blades has a first end that is connected to a periphery of the hub and a second end that is relatively away from the hub,
wherein a first axial direction distance in the axial direction is provided between a first point of the first end that is relatively away from the top surface and the top surface, and a second axial direction distance in the axial direction is provided between a second point of the first end that is relatively near the top surface and the top surface, and wherein a ratio of the second axial direction distance to the first axial direction distance is 0.4 to 0.5; and
a frame, wherein the hub is mounted to the frame, and the plurality of blades are disposed between the frame and the hub, wherein the frame has an upper surface and a lower surface that are opposite each other, a first perpendicular height in the axial direction is provided between the upper surface and the lower surface, a third axial direction distance in the axial direction is provided between a third point of the second end of each of the plurality of blades that is relatively near the upper surface and the upper surface, and the third axial direction distance is 0.05 to 0.1 times the first perpendicular height.

2. The fan module according to claim 1, wherein the hub further has a bottom surface opposite the top surface, a second perpendicular height in the axial direction is provided between the top surface and the bottom surface, the third point of the second end of each of the plurality of blades is aligned with the top surface of the hub, and the first perpendicular height is greater than the second perpendicular height.

3. The fan module according to claim 1, wherein a first perpendicular length of the first end of each of the plurality of blades in the axial direction is less than a second perpendicular length of the second end in the axial direction.

4. An electronic device, comprising:
a housing;
a fan module, wherein the fan module is disposed in the housing and includes a hub and a plurality of blades, wherein the hub has a top surface and a central axis, and a direction parallel to the central axis is an axial direction,
wherein the plurality of blades are mounted to the hub, and each of the plurality of blades has a first end that is connected to a periphery of the hub and a second end that is relatively away from the hub, and
wherein a first axial direction distance in the axial direction is provided between a first point of the first end that is relatively away from the top surface and the top surface, a second axial direction distance in the axial direction is provided between a second point of the first end that is relatively near the top surface and the top surface, and a ratio of the second axial direction distance to the first axial direction distance is 0.4 to 0.5; and
a frame, the hub mounted into the frame, and the plurality of blades disposed between the frame and the hub, wherein the frame has an upper surface and a lower surface that are opposite each other, a first perpendicular height in the axial direction is provided between the upper surface and the lower surface, a third axial direction distance in the axial direction is provided between a third point of the second end of each of the plurality of blades that is relatively near the upper surface and the upper surface, and the third axial direction distance is 0.05 to 0.1 times the first perpendicular height.

5. The electronic device according to claim 4, wherein the hub has a bottom surface opposite the top surface, a second perpendicular height in the axial direction is provided between the top surface and the bottom surface, the third point of the second end of each of the plurality of blades is aligned with the top surface of the hub, and the first perpendicular height is greater than the second perpendicular height.

6. The electronic device according to claim 4, further comprising:
a first element disposed in the housing, wherein a first perpendicular distance in the axial direction between the first element and the upper surface of the frame is greater than 0 and less than 0.4 times the first perpendicular height.

7. The electronic device according to claim 4, further comprising:
a second element disposed in the housing, wherein a second perpendicular distance in the axial direction between the second element and the lower surface of the frame is greater than 0 and less than 0.4 times the first perpendicular height.

8. The electronic device according to claim 4, wherein a first perpendicular length of the first end of each of the plurality of blades in the axial direction is less than a second perpendicular length of the second end in the axial direction.

* * * * *